United States Patent [19]

Suzuki et al.

[11] Patent Number: 5,610,428
[45] Date of Patent: Mar. 11, 1997

[54] SEMICONDUCTOR INTEGRATED CIRCUIT

[75] Inventors: Yukio Suzuki; Haruo Konishi; Yoshikazu Kojima, all of Chiba, Japan

[73] Assignee: Seiko Instruments Inc., Japan

[21] Appl. No.: 476,221

[22] Filed: Jun. 7, 1995

[30] Foreign Application Priority Data

Jun. 10, 1994 [JP] Japan .................................. 6-129256
Apr. 6, 1995 [JP] Japan .................................. 7-081591

[51] Int. Cl.$^6$ .......................... H01L 29/784; H01L 29/78
[52] U.S. Cl. ........................ 257/399; 257/400; 257/491
[58] Field of Search .................................. 257/399, 315, 257/488, 400, 394, 395, 491

[56] References Cited

U.S. PATENT DOCUMENTS 4,458,262  7/1984  Chao ......................................... 257/399

FOREIGN PATENT DOCUMENTS 6-61484  3/1994  Japan ..................................... 257/399

Primary Examiner—Donald L. Monin, Jr.
Attorney, Agent, or Firm—Adams & Wilks

[57] ABSTRACT

A semiconductor integrated circuit comprises a semiconductor substrate of a first conductivity type, at least one electrically erasable floating gate type semiconductor non-volatile memory transistor disposed on a surface of the semiconductor substrate, a well region of a second conductivity type formed in the surface of the semiconductor substrate, and a program voltage switching transistor of the first conductivity type disposed in the well region. A field insulation film is disposed on the surface of the semiconductor substrate. A field dope region of the first conductivity type is provided beneath the field insulation film. The field dope region preferably has an impurity concentration higher than an impurity concentration of the semiconductor substrate. By this construction, current leakage is prevented at the time when a high voltage occurs such as, for example, when performing a writing operation with respect to EEPROM.

3 Claims, 4 Drawing Sheets

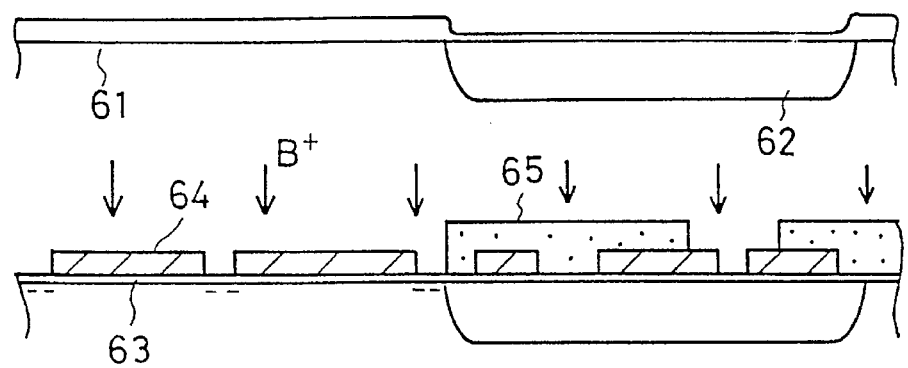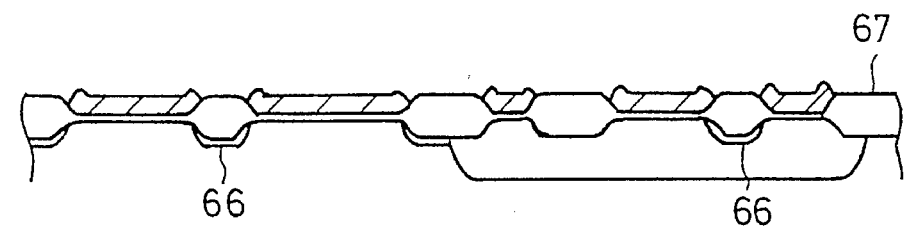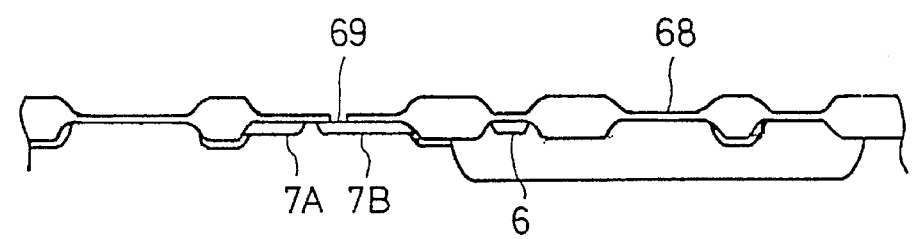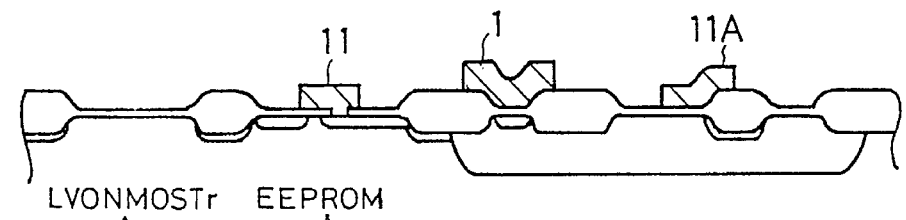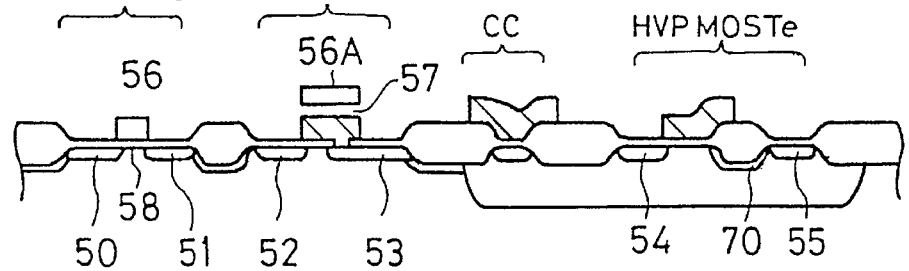

SEMICONDUCTOR INTEGRATED CIRCUIT

BACKGROUND OF THE INVENTION

This invention relates to a leakage current prevention circuit, the leakage current of which occurs when data writing is performed with respect to an EEPROM for example, EEPROM and a program voltage switching circuit.

FIGS. 3 and 4 are a plan view and a cross sectional view each of which illustrates part of a known MOS inverter of a semiconductor integrated circuit used in an EEPROM. In FIGS. 3 and 4, an NMOS 3 formed in a P-type semiconductor substrate (Psub) and a PMOS 2 (source 31 and drain 32) formed in an N well region 4 are connected to each other by a poly-silicon wiring 1 in order to provide a common gate. A conventional MOS pattern (for example the CMOS inverter formed in the Psub) was formed such that in order to reduce the cell size a PMOS gate and an NMOS gate were connected to each other by the poly-silicon wiring 1 in such a manner as to pass over a junction of the N well region 4 and the semiconductor substrate Psub.

However, in the MOS inverter according to the prior art, when a high voltage (Vpp) occurs at the time when data writing operation is performed with respect to the EEPROM, as illustrated in FIGS. 3 and 4 a leakage current flow path 33 from the PMOS to Psub was in some cases formed whereby leakage current flowed. That is, in case that the N well region 4 is at a potential of Vpp and the poly-silicon wiring is at a potential of 0, the semiconductor substrate surface of the N well region 4 right beneath the poly-silicon wiring 1 is inverted with the result that the leakage current path is inconveniently formed. As a result, leakage current flows along a path of source 31 of the PMOS 2, a channel of the PMOS 2 (P-type because of the on-state), the N well region right beneath the poly-silicon wiring (P-type because of the inverted state), and the semiconductor substrate Psub. Thus, the problem that such flow of leakage current adversely affects the writing characteristics exists.

The object of the present invention is to prevent, in order to solve the above problem, the occurrence of leakage current by cutting off part of the leakage current path.

SUMMARY OF THE INVENTION

In order to solve the above problem, the present invention is constructed such that a high-concentration N-type impurity diffusion ion implantation is done at a position which is in the surface of the N well region in the vicinity of the N well and the substrate Psub junction and which is located right beneath the poly-silicon wiring, and an N-type guard ring is formed. Specifically, the construction of the invention is given as follows.

(1) A a semiconductor integrated circuit including an electrically erasable floating gate type semiconductor non-volatile memory transistor formed in a surface of a first conductivity type semiconductor substrate, a second conductivity type well region formed in the surface of the semiconductor substrate, and a program voltage switching transistor which is a high voltage structural first conductivity type insulated gate field effect transistor formed in the surface of the second conductivity type well region, the semiconductor integrated circuit being characterized in that a second conductivity type channel cut region having an impurity concentration higher than the impurity concentration of the second conductivity type well region is formed right beneath a poly-silicon wiring extending from a gate electrode of the program voltage switching transistor and in a surface of the well region located in the vicinity of the semiconductor substrate and the well junction.

(2) A semiconductor integrated circuit as described under the above item (1), wherein the impurity profile of the channel cut region and the impurity profile of a tunnel drain region formed right beneath a floating gate electrode of the memory transistor are the same.

(3) A semiconductor integrated circuit as described under the above item (1), wherein the channel cut region is formed along a periphery of the well region.

(4) A manufacturing method for a semiconductor integrated circuit including an electrically erasable floating gate type semiconductor non-volatile memory transistor formed in a surface of a first conductivity type semiconductor substrate, a second conductivity type well region formed in the surface of the semiconductor substrate, a program voltage switching transistor which is a high voltage structural first conductivity type insulated gate field effect transistor formed in the surface of the second conductivity type well region, and a second conductivity type channel cut region formed in a surface portion of the well region located beneath a poly-silicon wiring extending from a gate electrode of the program voltage switching transistor, the manufacturing method comprising: the step of forming the well region on the surface of the semiconductor substrate, the step of simultaneously forming the channel cut region and a drain region of the floating gate type semiconductor non-volatile memory transistor, the step of forming a gate insulation film on the surface of the semiconductor substrate and the well region on respective of the floating gate type semiconductor non-volatile memory transistor, channel cut region, and program voltage swtiching transistor, the step of removing the gate insulation film formed on the drain region and forming a tunnel region, the step of forming a tunnel insulation film in the tunnel region, and the step of forming a poly-silicon film onto the gate insulation film, semiconductor substrate, and well region and patterning the poly-silicon film to thereby form a floating gate, the gate electrode, and the poly-silicon wiring.

(5) A semiconductor integrated circuit including a plurality of electrically erasable floating gate type semiconductor non-volatile memory transistors formed in a surface of a first conductivity type semiconductor well region, a second conductivity type semiconductor substrate, and a program voltage switching transistor which is a high voltage structural first conductivity type insulated gate field effect transistor formed in the second conductivity type well region, the semiconductor integrated circuit being characterized in that a surface portion of the semiconductor substrate between the memory transistors is composed of a field insulation film and a first conductivity type field dope region provided beneath the field insulation film and having an impurity concentration higher than the impurity concentration of the semiconductor substrate; and a drain region of the program voltage switching transistor is formed to the same low-concentration impurity profile as that of the field dope region.

(6) A manufacturing method for a semiconductor integrated circuit including a plurality of electrically erasable floating gate type semiconductor non-volatile memory transistors formed in a surface of a first conductivity type semiconductor substrate, a second conductivity type semiconductor well region, and a program voltage switching transistor which is a high voltage structural first conductivity type insulated gate field effect transistor formed in the second conductivity type well region, the manufacturing method comprising: the step of forming the second conductivity type well region in the surface of the semiconductor substrate, the step of forming an oxidation mask film on the semiconductor substrate, the step of patterning the oxidation mask film, the step of forming a resist film in a surface of the well region other than that where the program voltage switching transistor is formed, the step of ion implanting a first conductivity type impurity with respect to the surface of the semiconductor substrate by using the resist film as a mask, the step of selectively oxidizing the surface of the semiconductor substrate by using the oxidation mask film as a mask, the step of removing the oxidation mask film and forming a transistor region, the step of forming a gate insulation film on the transistor region, and the step of patterning a poly-silicon film on the gate insulation film and forming floating gate electrodes of the memory transistors and a gate electrode of the program voltage switching transistor.

BRIEF DESCRIPTION OF THE DRAWINGS

FIGS. 7A to 7F present cross sectional views of sequential manufacturing process steps illustrating a method for manufacturing the semiconductor integrated circuit according to the present invention.

DETAILED DESCRIPTION OF THE PREFERRED EMBODIMENTS

An embodiment of the present invention will now be described with reference to the drawings.

Figure 1:
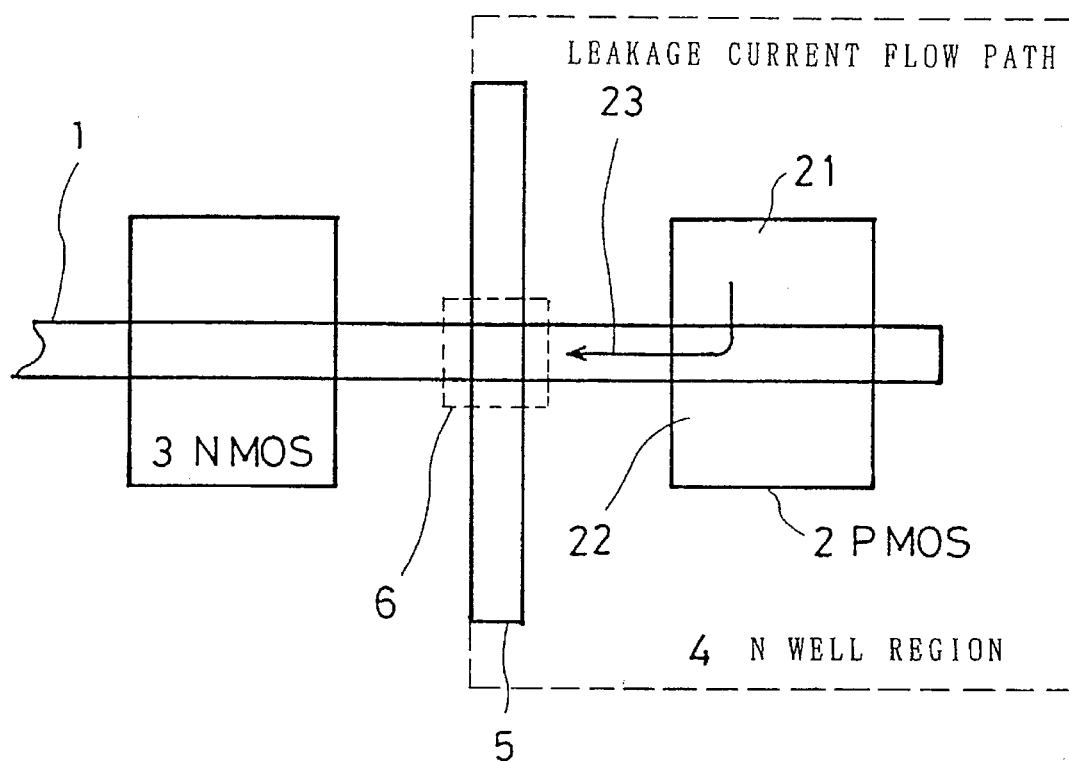
FIG. 1 is a plan view illustrating a semiconductor integrated circuit according to the present invention.
Figure 2:
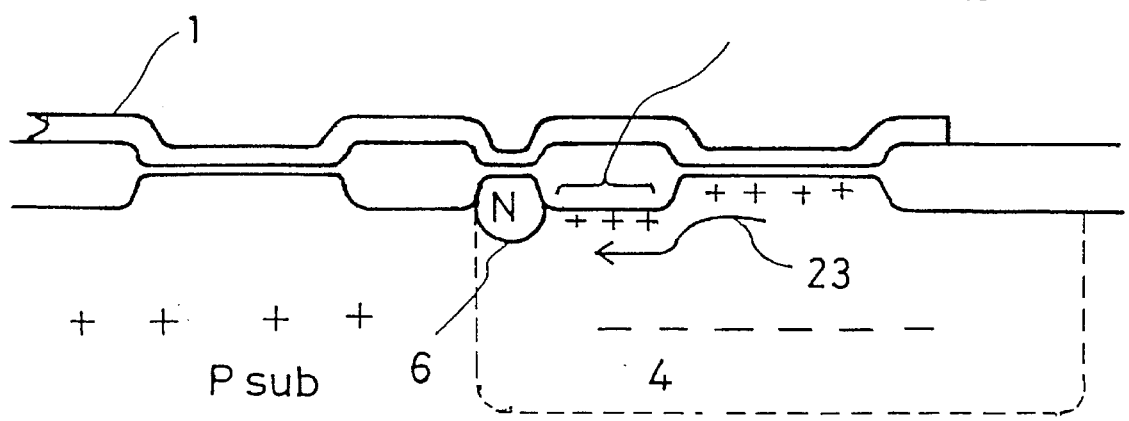
FIG. 2 is a cross sectional view illustrating the semiconductor integrated circuit according to the present invention.
Figure 3:
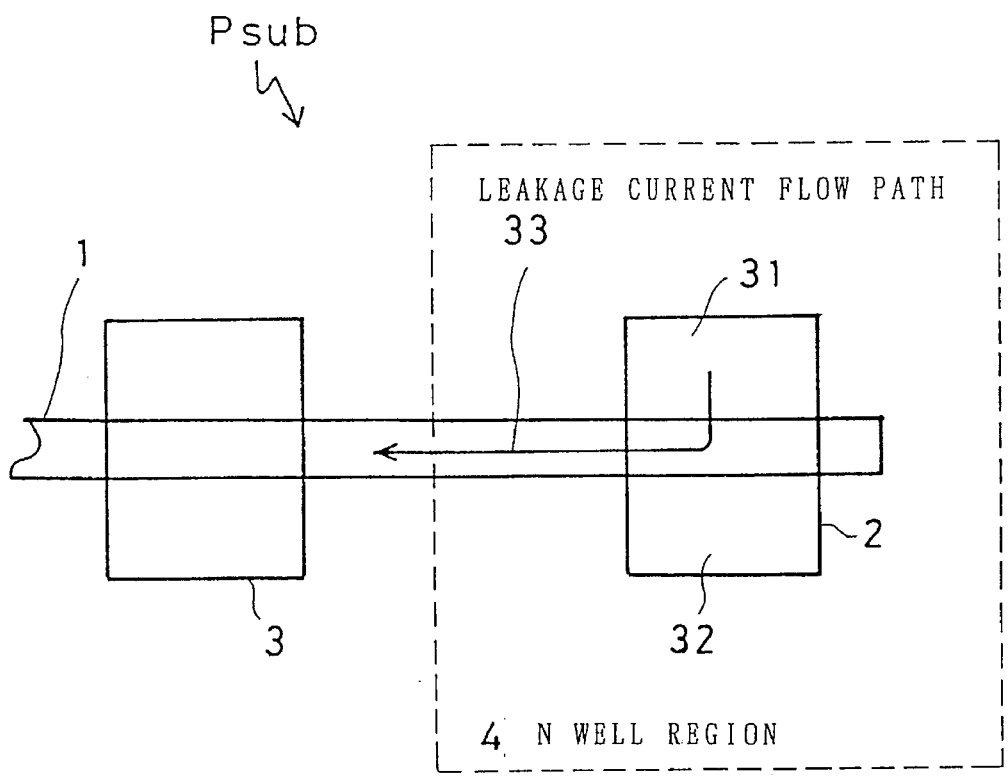
FIG. 3 is a plan view illustrating a conventional semiconductor integrated circuit.
Figure 4:
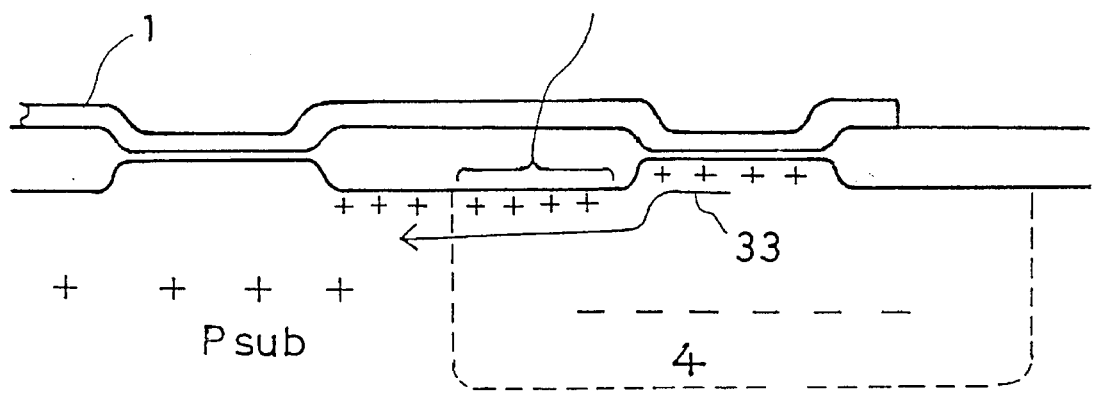
FIG. 4 is a cross sectional view illustrating the conventional semiconductor integrated circuit.

FIG. 1 illustrates an embodiment of the present invention and FIG. 2 illustrates a cross sectional view of the structure thereof. A poly-silicon wiring 1 connects to the transistor gate of a PMOS 2 (source 21 and drain 22) in an N well region 4 (e.g., phosphorus 150 kV, 3.5 E 12) as well as to the transistor gate of an NMOS 3 in the semiconductor substrate Psub. At a periphery of the N well region 4 there is formed an N-type guard ring 5 for the N well region 4 and, at a position right beneath a portion of the intersection between the guard ring 5 and the poly-silcon wiring 1, a tunnel drain ion implantation 6 (e.g., arsenic 100 kV, 6.0 E14) is made which is used for an active region of an EEPROM memory.

Figure 5:
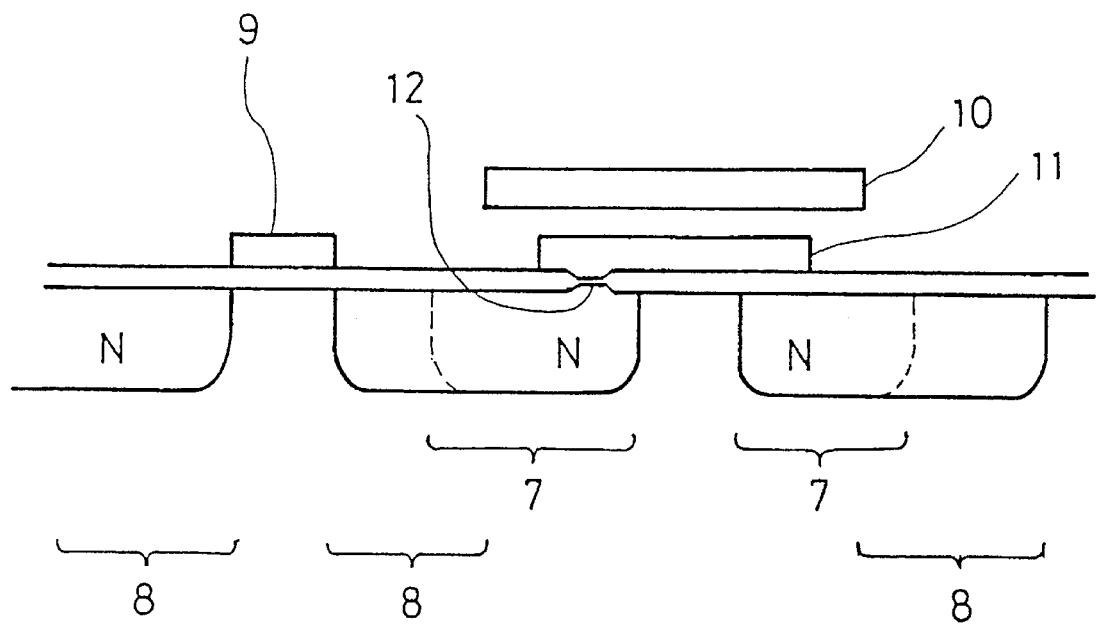
FIG. 5 is a cross sectional view illustrating an EEPROM memory.

FIG. 5 illustrates a sectional view of the structure of the EEPROM memory and a tunnel drain ion implantation 7. Since the tunnel drain ion implantations 7 are made before the poly-silicon deposition step, they exist right beneath a control gate 10 and a floating gate 11. On the other hand, since NMOS source/drain diffusion ion implantations 8 are made after the poly-silicon deposition step, they do not exist right beneath a select gate 9, a control gate 10, and a floating gate 11 but are each structurally self-aligned. The reference numeral 12 denotes a tunnel window through which when performing writing with respect to the EEPROM electron flows.

Assume now that in the writing operation of the EEPROM, a high voltage (for example, 22 [V]) is generated with the result that the N well region 4 is at a potential of 22 [V] an the poly-silicon wiring 1 is at a potential of 0 [V]. Then, due to the high voltage difference, the N well region surface right beneath the poly-silicon wiring 1 is inverted to become a P-type. However, since the N-type impurity having a higher impurity concentration is ion implanted at the corresponding-to-guard-ring portion right beneath the poly-silicon wiring 1, no inversion occurs. Accordingly, although a leakage current path 23 is formed at up to the N well right beneath the poly-silicon wiring 1 from the via PMOS source 21 via PMOS channel, this path 23 is cut off at the corresponding-to-guard-ring portion right beneath the poly-silicon wiring 1. Therefore, the leakage current path 23 which has been blocked there does not reach the substrate Psub, so that no leakage current occurs.

In case that an NMOS source/drain ion implantation is adopted as the ion implantation made right beneath the intersection portion, this ion implantation is not done right beneath the poly-silicon wiring because it is done after the poly-silicon deposition step. However, in the case of the tunnel drain ion implantation made for purpose of EEPROM memory, this ion implantation is firmly done right beneath the poly-silicon wiring because it is done before the poly-silicon wiring step.

Figure 6:
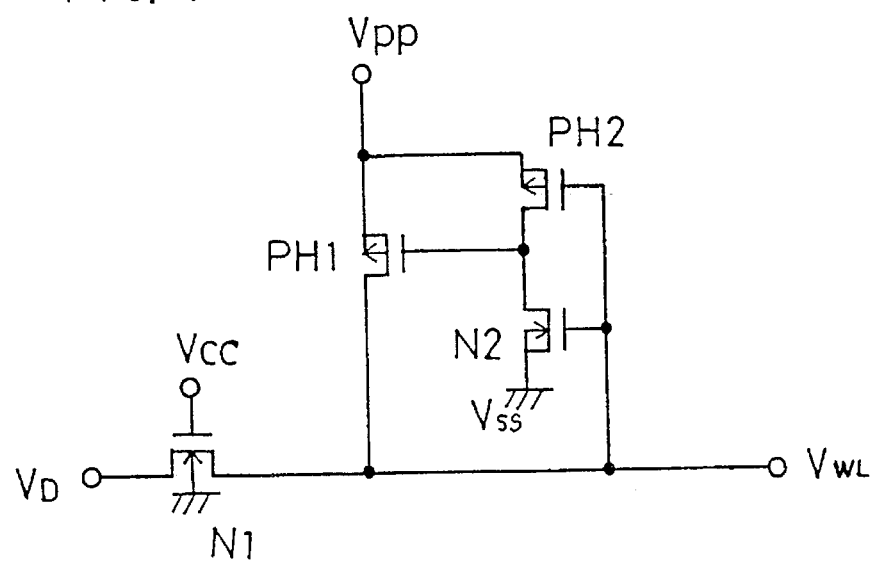
FIG. 6 is a circuit diagram illustrating the semiconductor integrated circuit according to the present invention.

FIG. 6 is a circuit diagram illustrating a program voltage switching circuit for use in EEPROM. A high voltage of approximately 15 to 20 V is generated from a power supply voltage (low voltage of 5 V or less) by a high voltage generator. $V_{PP}$ represents an output voltage of the program voltage generator circuit composed of a high voltage generator while, on the other hand, $V_D$ represents the voltage of a decoder for switching the word-line potential of each memory, which voltage is connected to the output of a decoder circuit. $V_{WL}$ represents the voltage level of a relevant word line for EEPROM, which voltage level is connected to a relevant word line for EEPROM. A transistor N1 represents a clamp transistor which serves to perform electrical separation between the high voltage generator circuit operating with a high voltage and the decoder circuit operating with the power supply voltage. High-voltage PMOS transistors PH1, PH2 and NMOS transistor N2 are circuits which according to the output voltage $V_D$ of the decoder circuit selectively change over the word line voltage to $V_{PP}$ or 0 V. In case that the output voltage $V_D$ of the decoder circuit is at a level of $V_{SS}$, the voltage $V_{SS}$ is transmitted to the word line. In case that the output voltage $V_D$ of the decoder circuit is at a level of $V_{DD}$, the voltage $V_{PP}$ is transmitted to the word line. The high-voltage PMOS transistor PH1 or PH2 which is a program voltage switching circuit and which plays an important role is formed, according to the present invention, with a structure as shown in FIGS. 7A to 7F. FIGS. 7A to 7F present sectional views illustrating sequential process steps of manufacturing the semiconductor integrated circuit according to the present invention. Phosphorus which is an N type impurity is ion implanted, using an ordinary photolithography process, in a portion of the surface of a P type silicon single crystal substrate 61 where a PMOS transistor is to be formed. Phosphorus is diffused in the direction of the depth of the substrate 61 at a high temperature of 1150° C. for a time period which is as long as 10 hours, to thereby form an N well region 62 as illustrated in FIG. 7A.

Next, an oxide film 63 of 500 Å (angstrom) and a silicon nitride film 64 which is an oxidation mask film are sequentially formed on the surface of the substrate 61. Patterning is performed, using an ordinary photolithography process, with respect to the silicon nitride film 64 corresponding to the separation region and a drain region of the high voltage PMOS transistor. Further, as illustrated in FIG. 7B, the NMOS transistor formation region and other portions of the drain region of the high voltage transistor are masked by a resist film 65 and, in this condition, boron which is a P type impurity is ion implanted. The surface of the N well region 62 is almost entirely masked by the resist film 65 except for the drain region of the high voltage PMOS transistor.

Next, as illustrated in FIG. 7C, selective oxidation is performed using the silicon nitride film 64 as a mask. By selective oxidation, the separation region of the NMOS transistor region becomes completed. Namely, a field dope region 66 is formed beneath the resulting field oxide film 67 and this dope region 66 becomes the separation region. The separation region of the PMOS transistor region also becomes completed. The separation region of the PMOS transistor region is composed by the field oxide film with no field dope region formed therebeneath. Further, by selective oxidation, simultaneously, the drain region of the high voltage PMOS transistor is formed. Namely, the drain region 70 thereof at the time when the high-voltage PMOS transistor is completed as in FIG. 7F is formed. The field oxide film 67 has a thickness of 3000 to 15000 Å.

Next, the silicon nitride film 64 and the oxide film 63 are removed, after which a gate oxide film 68 is formed in regions of the transistor region other than the separation region 66. Prior to the formation of the gate oxide film, a source region 7A and a drain region 7B of EEPROM and a channel cut region 6 are formed.

After the gate oxide film 68 is formed, this gate oxide film is removed by etching with the use of an ordinary photolithography process to thereby form a tunnel region 69. A thin insulation film having a thickness of approximately 70 to 100 Å is formed in the tunnel region 69. An oxide film having a thickness of 500 to 1500 Å is simultaneously formed, as a gate oxide film, on the channel cut region 6. Next, as illustrated in FIG. 7E, a first poly-silicon film is formed and patterning is performed with respect thereto. As a result, a floating gate electrode 11 is patterned on the tunnel region 69 located on the tunnel drain region 7B. The floating gate electrode 11 is formed in a range of from the source region 7A to the tunnel drain region 7B, via the gate oxide film 68. Further, a gate electrode 11A of the high voltage PMOS transistor is also simultaneously formed. The EEPROM and the high voltage PMOS transistor each need to have a voltage level as high as approximately 20 V. Accordingly, the gate oxide film 68 has a film thickness of 300 to 1000 Å. The insulation film on the channel cut (hereinafter abbreviated as 'CC') region 6 is also formed simultaneously with the formation of this gate oxide film 68. Since the channel cut region 6 is formed with an N type high impurity concentration of $10^{19}$ atoms/cm$^3$ or more, enhanced oxidation is effected with the result that the oxide film becomes somewhat thicker. On the channel cut region 6 there is formed the poly-silicon wiring 1 extending from the gate electrode 11A of the high voltage PMOS transistor. As illustrated in FIG. 7E, the channel cut region 6 is formed, prior to forming the poly-silicon wiring, simultaneously with the formation of the tunnel drain region 7B of the EEPROM. Accordingly, a high-performance channel cut region 6 can be formed without using any additional process step. In addition to and in place of the channel cut region 6, by forming this N$^+$ type region in such a way as to extend along and surround the outer periphery of the N well region, such N$^+$ type region can be used also as a guard ring for enhancing the latchup characteristics. Next, as illustrated in FIG. 7F, a gate oxide film 58 of the low voltage MOS transistor and a control gate oxide film 57 are simultaneously formed, after which a second poly-silicon film is formed on the surface of the resulting substrate. Then, patterning thereof is done. The thus patterned second poly-silicon film becomes a low voltage MOS transistor gate electrode 56 (a low-voltage PMOS transistor is simultaneously formed though not illustrated) and a control gate electrode 56A. Next, a P type impurity and an N type impurity are ion implanted using the poly-silicon film as a mask in order to form a source/drain region of each transistor. As a consequence, a source region 50/drain region 51 of the low-voltage transistor (LVMOS Tr), and a source region 52/drain region 53 of the EEPROM are formed as N$^+$ type regions. Further, a source region 54/drain region 55 of the high-voltage MOS transistor (HV PMOS Tr) are formed.

As illustrated in FIG. 7F, the high voltage PMOS transistor which is used as the program voltage switching circuit of the present invention has a special drain structure. Namely, the drain region is composed of a low-concentration drain region 70 and a high-concentration drain region 55. The low-concentration drain region 70 is formed simultaneously with the field dope region of the NMOS transistor and this drain region 70 is lower in concentration than the high-concentration drain region 55. Further, on the low-concentration drain region 70, the same-patterned (self-aligned) field oxide film 67 is formed. At the gate-electrode-11A-side end portion of the drain region, the gate electrode 11A and the lower-concentration drain region 70 are formed via the field oxide film 67. Although not illustrated, the low-voltage PMOS transistor is composed solely of the low-concentration drain region 70 and the ordinary high-concentration drain region 55 with no field oxide film.

Although the source region 54 of the FIG. 7F illustrated high voltage PMOS transistor is formed as a high-concentration region, this source region 54 may be formed into a high voltage structure symmetrical with the structure of the drain region. Besides, the high voltage PMOS transistor is formed for the purpose of switching the program voltage. Accordingly, the threshold voltage of this PMOS transistor is 1-V-or-more enhanced side so as to lessen the leakage current. Generally, in case that a threshold voltage adjusting step is not used, the threshold voltage value is set to be at the 2-V-or-less enhanced side.

With the above-mentioned arrangement, an N-type impurity layer having an N-type impurity concentration much higher than that of the N well region is formed in a portion of the N well region located right beneath the poly-silicon wiring at a position where the poly-silicon wiring intersects the junction of the N well region and the semiconductor substrate Psub, thereby the leakage current path which is formed due to the inversion of the substrate surface can be cut off, thereby the occurrence of the leakage current is prevented.

As described above, the present invention can prevent inversion of the substrate surface at the time when a high voltage is generated and thereby prevent the occurrence of leakage current.

Further, since the tunnel drain ion implantation technique is used, the present invention has the advantage of production thereof without increasing the number of the mask process steps for manufacture of EEPROM.

What is claimed is:

1. A semiconductor integrated circuit comprising: a plurality of electrically erasable floating gate type semiconductor non-volatile memory transistors formed in a surface of a semiconductor substrate of a first conductivity type; a semiconductor well region of a second conductivity type; and a program voltage switching transistor comprised of a high voltage structural insulated gate field effect transistor of the first conductivity type provided in the semiconductor well region; wherein a surface portion of the semiconductor substrate between the memory transistors has a field insulation film and a field dope region of the first conductivity type formed beneath the field insulation film and having an impurity concentration higher than an impurity concentration of the semiconductor substrate; and wherein a drain region of the program voltage switching transistor is formed with the same low-concentration impurity profile as that of the field dope region.

2. A semiconductor integrated circuit comprising: a semiconductor substrate of a first conductivity type; at least one electrically erasable floating gate type semiconductor non-volatile memory transistor disposed on a surface of the semiconductor substrate; a well region of a second conductivity type formed in the surface of the semiconductor substrate; a program voltage switching transistor of the first conductivity type disposed in the well region; a field insulation film disposed on the semiconductor substrate; and a field dope region of the first conductivity type disposed beneath the field insulation film, the field dope region and a drain region of the program voltage switching transistor having the same low-concentration impurity profile.

3. A semiconductor integrated circuit as claimed in claim 2; wherein the field dope region has an impurity concentration higher than an impurity concentration of the semiconductor substrate.

* * * * *